United States Patent [19]

Kalnitsky et al.

[11] Patent Number: 4,836,902
[45] Date of Patent: Jun. 6, 1989

[54] METHOD AND APPARATUS FOR REMOVING COATING FROM SUBSTRATE

[75] Inventors: Alexander Kalnitsky, Ottawa; Joseph P. Ellul; Sing P. Tay, both of Nepean, all of Canada

[73] Assignee: Northern Telecom Limited, Montreal, Canada

[21] Appl. No.: 106,214

[22] Filed: Oct. 9, 1987

[51] Int. Cl.[4] .................. H01L 21/306; B44C 1/22; C23C 14/22
[52] U.S. Cl. .................... 204/192.32; 204/192.35; 204/192.36; 204/298; 156/345; 156/643
[58] Field of Search .............. 156/345, 643; 204/298, 204/192.32, 192.35, 192.36, 192.37

[56] References Cited

U.S. PATENT DOCUMENTS

| 3,879,597 | 4/1975 | Bersin | 219/121 |
|---|---|---|---|
| 4,158,589 | 6/1979 | Keller et al. | 156/345 |
| 4,358,686 | 11/1982 | Kinoshita | 250/492.2 |
| 4,512,868 | 4/1985 | Fujimura | 156/643 |
| 4,540,466 | 9/1985 | Nishizawa | 156/643 |
| 4,595,484 | 6/1968 | Giammanco et al. | 204/298 |
| 4,609,428 | 9/1986 | Fujimura | 156/643 |
| 4,631,105 | 12/1986 | Carroll et al. | 156/345 |
| 4,673,456 | 6/1987 | Spencer | 156/345 |
| 4,699,689 | 10/1987 | Bersin | 156/643 |
| 4,718,974 | 1/1988 | Minaee | 156/643 |
| 4,718,976 | 1/1988 | Fujimura | 156/643 |

Primary Examiner—John F. Niebling
Assistant Examiner—Ben C. Hsing
Attorney, Agent, or Firm—R. J. Austin; C. W. Junkin

[57] ABSTRACT

In a method and apparatus for plasma stripping a polymer photoresist coating from a semiconductor substrate, ultraviolet radiation generated as a byproduct of plasma generation is absorbed by a baffle placed between a plasma source and the substrate. The baffle inhibits incidence of ultraviolet light on the substrate while permitting flow of activated gas onto the substrate to chemically strip the photoresist from the substrate. Use of the baffle reduces microscopic damage to the substrate.

5 Claims, 2 Drawing Sheets

METHOD AND APPARATUS FOR REMOVING COATING FROM SUBSTRATE

The present invention relates to a method and apparatus for removing a layer of coating material from a substrate.

Layers of coating material, such as polymer photoresist, are commonly applied to substrates, such as semiconductor wafers, during the manufacture of semiconductor devices. It is known to remote such layers of coating material from the substrates by activating a gas and bringing the activated gas into contact with the layer of coating material to break down the coating material and strip it from the substrate. The activated gas, for example atomic oxygen, reacts chemically with the coating material to form gaseous products, thereby stripping the coating material from the substrate.

The gas may be activated by application of a microwave or radio frequency electric field to generate a plasma of the gas, or by application of ultraviolet light to the gas. In both cases, ultraviolet irradiation of the substrate is a byproduct of the activation process. The ultraviolet irradiation of the substrate is known to cause microscopic surface damage to the substrate.

U.S. Pat. No. 4,673,456 issued in the name of J. E. Spencer et al on June 16, 1987 discloses a photoresist stripping apparatus in which reactive gas is activated in an activation chamber and passed from the activation chamber through a bent tube to a reaction chamber where the activated gas comes into contact with a coated substrate to strip a coating from the substrate. The bent tube prevents direct ultraviolet irradiation of the substrate since there is no straight line path between the activation chamber and the substrate along which ultraviolet radiation generated in the activation chamber may propagate. However, reflective walls of the tube enable the tube to act as a lossy waveguide for ultraviolet radiation so that some ultraviolet radiation is guided along the bent tube and onto the substrate where it may damage the substrate. Thus, while the bent tube may reduce ultraviolet radiation damage to the substrate, it does not eliminate this source of damage entirely.

The present invention seeks to provide a method and apparatus for removing a layer of coating material from a substrate which reduces further ultraviolet radiation damage to the surface of the substrate.

According to one aspect of the present invention, there is provided a method for removing a layer of coating material from a substrate, comprising: activating a gas in an activation chamber; and passing the activated gas from the activation chamber, past at least one ultraviolet radiation absorbing surface and onto a layer of coating material to break down the coating material and strip it from a substrate, said at least one surface being arranged to block any straight line path from the activation chamber to the substrate.

According to another aspect of the present invention, there is provided apparatus for removing a layer of coating mterial from a substrate, comprising: means for supporting a substrate in a support position; means for activating a gas; and a baffle having at least one ultraviolet radiation absorbing surface disposed between the activating means and the support position, said at least one surface blocking any straight line path between the activating means and the support position, space being provided adjacent said at least one surface to permit gas flow from the activating means past the at least one surface to the support position.

The method and apparatus of the present invention provide an ultraviolet radiation absorbing surface which inhibits ultraviolet irradiation of the substrate as a byproduct of the activation process, thereby avoiding a cause of microscopic damage to the surface of the substrate.

The apparatus may comprise a reaction chamber having an inlet communicating with the activating means, the reaction chamber containing the support means for supporting the substrate in a support position within the reaction vessel. The baffle may comprise an ultraviolet radiation absorbing plate disposed between the inlet and the support position to block any straight line path between the inlet and the support position while permitting gas flow around the plate to permit gas flow between the inlet and the support position. The baffle may further comprise an ultraviolet radiation absorbing frame disposed between the plate and the support position and having an opening between the plate and the support position. The baffle may be coated with an ultraviolet radiation absorbing material, such as polysilicon, or may be machined out of ultraviolet radiation absorbing material, such as silicon or other semiconducting or conducting material.

Thus, according to yet another aspect of the invention, there is provided an ultraviolet radiation absorbing baffle comprising a frame having an opening therethrough and a plate spaced apart from the frame and extending over the entire opening, the frame and plate having ultraviolet radiation absorbing surfaces.

An embodiment of the invention will now be described, by way of example only, with reference to the accompanying drawings, in which.

Figure 1:
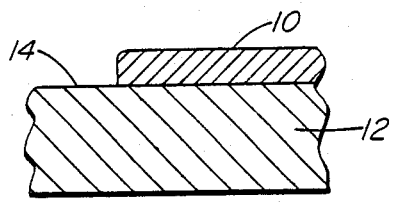
FIG. 1 is a cross-sectional view of a substrate carrying a layer of coating material.

Referring to FIG. 1, a layer 10 of coating material in the form of polymer photoresist is commonly applied to a substrate 12 in the form of a semiconductor wafer during the manufacture of semiconductor devices. The layer 10 may extend over all or part of a surface 14 of the substrate 12, and the substrate may include layers of oxide, nitride, metal or polycrystalline semiconductor material in addition to monocrystalline semiconductor material.

Figure 2:
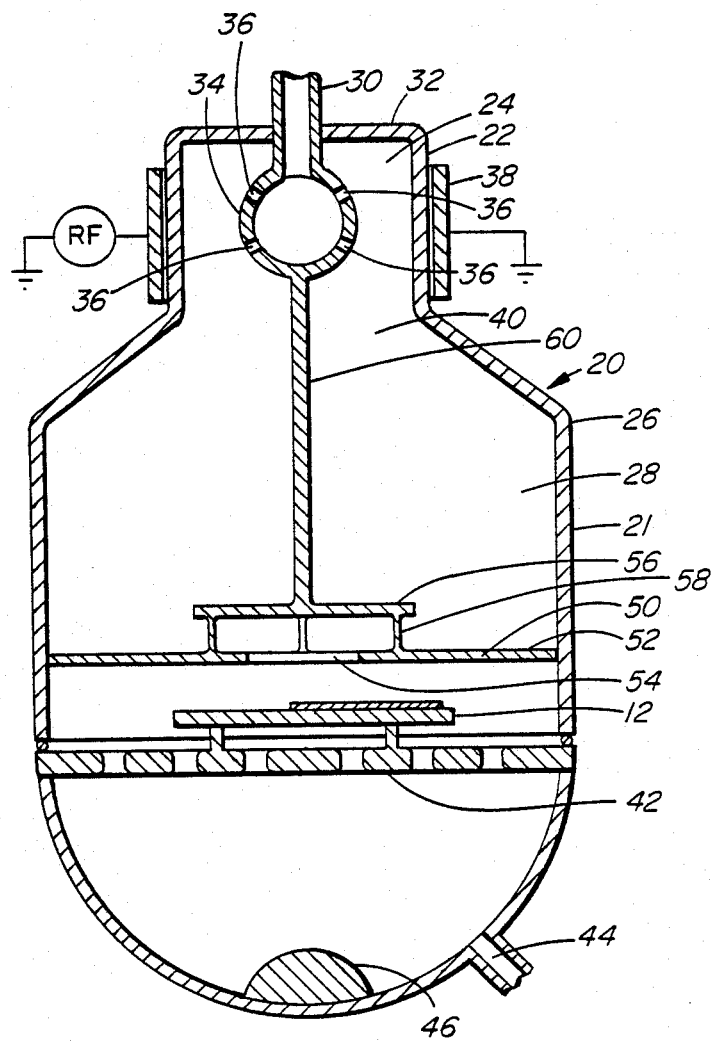
FIG. 2 is a cross-sectional view of a part of a conventional plasma stripping apparatus.

It is frequently necessary to remove such a layer from such a substrate, and for this purpose a known plasma stripping apparatus 20, shown in part in FIG. 2, is used. The plasma stripping apparatus 20 comprises a quartz vessel 21 having an upper neck portion 22 defining an activation chamber 24 and a lower body portion 26 defining a reaction chamber 28.

A quartz tube 30 passes through an end wall 32 of the activation chamber 24 and terminates in a quartz bulb 34 within the activation chamber. Several holes 36 penetrate the bulb 34 to connect the interior of the bulb to the activation chamber 24. The activation chamber 24 is surrounded by conducting plates 38 to which radio frequency signals may be applied to activate gases fed into the activation chamber. Thus, the tube 30, bulb 34, activation chamber 24 and plates 38 together provide means for activating a gas.

The activation chamber 24 communicates with the reaction chamber 28 via an opening defining an inlet 40 of the reaction chamber. Within the reaction chamber 28 a quartz support 42 is provided for supporting the substrate 12 in a support position between the inlet 40 and an exhaust outlet 44. When placed in a support position on the support 42, the substrate 12 is heated by means of a radiative heater 46.

A quartz baffle 50 is provided between the inlet 40 and the support position to improve the uniformity of activated gas flow at the support position. The baffle 50 comprises a quartz frame 52 having a central opening 54 and a quartz plate 56 which is connected to the frame by circumferentially spaced quartz connecting members 58. The connecting members 58 hold the plate 56 in a position in which it is spaced apart from the frame 52 and extends over and beyond edges of the opening 54. The baffle 50 is supported within the reaction chamber 28 by means of a quartz rod 60 extending through the inlet 40 of the reaction chamber and connected to the quartz bulb 34 in the activation chamber 24.

The L3200 Single Wafer Stripper manufactured by Branson International Plasm Corporation of Hayward, Calif., is one such plasma stripping apparatus.

In use of the plasma stripping apparatus, a reactive gas is fed into the activation chamber 24, and a radio frequency signal is applied to the plates 38 to generate a plasma of the reactive gas within the activation chamber. The resulting activated gas is drawn through the inlet 40 by means of a pressure differential and into the reaction chamber 28 onto the coating layer 10 on the substrate 12 which is placed on the support 42 and heated by the heater 46. The gas may be $O_2$, $CF_4$, $SF_6$ or freon gas. Such gases, when activated, chemically react with polymer photoresist to break it down and form gaseous products. The gaseous products are drawn from the reaction chamber 28 through the exhaust outlet 44.

In the above process, ultraviolet radiation is generated in the activation chamber 24 as a byproduct of the gas activation process. This ultraviolet radiation penetrates the quartz baffle 50 and is therefore incident, on the substrate 12 where it contributes to microscopic damage of the substrate surface 14 which degrades the performance of electronic devices manufactured from the substrate.

Figure 3:
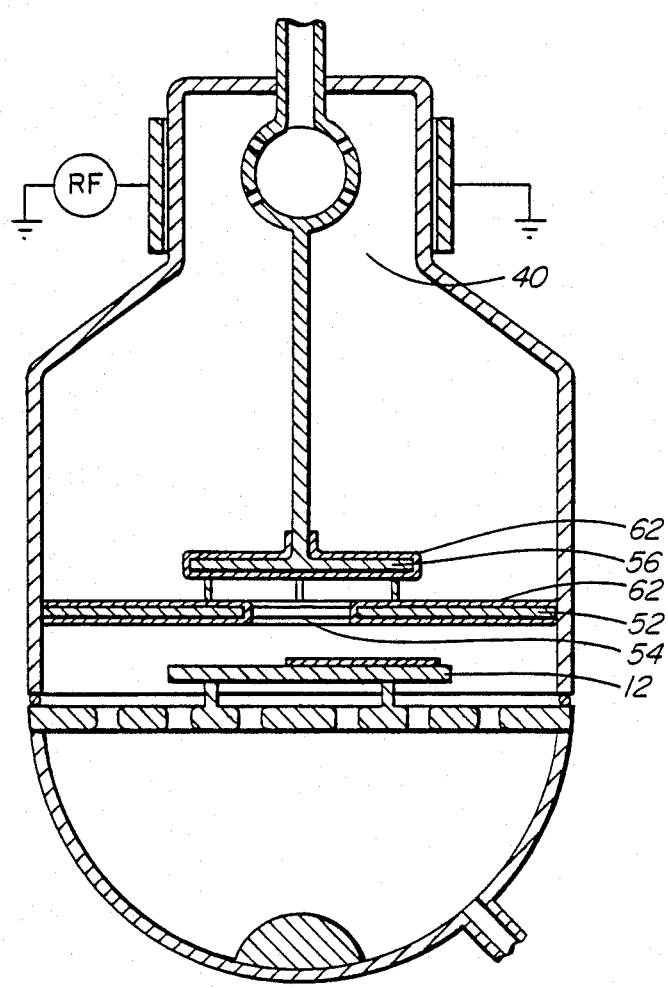
FIG. 3 is a cross-sectional view of a part of a plasma stripping apparatus according to an embodiment of the invention.

A plasma stripping apparatus according to an embodiment of the invention, as shown in FIG. 3, inhibits the above problem. The apparatus is basically constructed in a manner similar to the apparatus of FIG. 2, and in the following description, the same reference numerals will be used for such parts as were described with reference to FIG. 2. The embodiment differs from the prior arrangement in that the plate 56 and frame 52 of the baffle 50 are coated with polycrystalline silicon 62 so as to absorb ultraviolet radiation. The polycrystalline silicon is passivated by oxidation to inhibit reaction of the silicon with the activated gas.

In use of the apparatus according to the embodiment, the coated plate 56 and coated frame 52, provides an ultraviolet radiation absorbing surface which blocks any straight line path between the inlet 40 and the support position of the substrate 12. Consequently, incidence of ultraviolet radiation from thee activation chamber 24 onto the substrate 12 is inhibited, and resulting microscopic damage to the substrate surface 14 is reduced. Space is provided around the plate 56 to permit flow of activated gas from the inlet 26 around the plate and through the opening 54 in the frame 52 onto the substrate 12 and coating layer 10 as is required for stripping of the coating layer from the substrate.

The baffle 50 may adopt any suitable shape provided that it has at least one ultraviolet radiation absorbing surface which blocks any straight line path between the activation chamber and the support position so as to block incidence of ultraviolet radiation from the activation chamber onto the substrate and provided that space is provided adjacent that surface to permit gas flow from the activation chamber past the surface onto the substrate in the support position. The baffle may be constructed from or coated with any suitable ultraviolet radiation absorbing material.

The reactive gas may be activated by methods other than application of radio or microwave frequency electric fields. For example, the gas could be activated by exposure to ultraviolet radiation in the activation chamber 24, the baffle 50 inhibiting incidence of the ultraviolet radiation from the activation chamber 24 onto the substrate 12.

What is claimed is:

1. A method for removing a layer of coating material from a silicon substrate, comprising:
    activating a gas in an activation chamber; and
    absorbing ultraviolet radiation generated during activation of the gas at at least one ulraviolet radiation absorbing surface which is constructed of polysilicon and passivated by oxidation, said at least one ultraviolet radiation absorbing surface being arranged to block any straight line path from the activation chamber to the silicon substrate; while
    passing the activated gas from the activation chamber past the at least one ultraviolet radiation absorbing surface and into contact with the layer of coating material to break down the coating material and strip it from the silicon substrate.

2. A method as defined in claim 1, wherein the coating is polymer photoresist and the gas is selected from a group consisting of $O_2$, $CF_4$, $SF_6$ and freon gas.

3. A method as defined in claim 1, wherein the gas is activated by application of a microwave or radio frequency electric field to generate a plasma.

4. A method as defined in claim 1, wherein the gas is activated by application of ultraviolet radiation.

5. A method as defined in claim 1, wherein the activated gas is drawn from the activation chamber past the at least one surface and into contact with the coating material by means of a pressure differential.

* * * * *